(12) United States Patent
Bauer et al.

(10) Patent No.: US 10,726,586 B2
(45) Date of Patent: Jul. 28, 2020

(54) MOVEMENT-DEPENDENT RECONSTRUCTION OF MAGNETIC RESONANCE IMAGES

(71) Applicant: Siemens Healthcare GmbH, Erlangen (DE)

(72) Inventors: Simon Bauer, Baunach (DE); Ralf Kartäusch, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 41 days.

(21) Appl. No.: 16/029,538

(22) Filed: Jul. 6, 2018

(65) Prior Publication Data

US 2019/0012813 A1    Jan. 10, 2019

(30) Foreign Application Priority Data

Jul. 7, 2017 (DE) .......... 10 2017 211 677

(51) Int. Cl.
*G06T 11/00* (2006.01)
*G01R 33/565* (2006.01)
(Continued)

(52) U.S. Cl.
CPC ........ *G06T 11/005* (2013.01); *G01R 33/4824* (2013.01); *G01R 33/5611* (2013.01);
(Continued)

(58) Field of Classification Search
CPC .......... G01R 33/5611; G01R 33/56509; G01R 33/5676; G01R 33/4824; G06T 11/005
See application file for complete search history.

(56) References Cited

U.S. PATENT DOCUMENTS 6,121,774 A * 9/2000 Sun ............. G01N 24/081
324/303
6,195,579 B1 * 2/2001 Carroll ............ G01R 33/561
324/306
(Continued)

FOREIGN PATENT DOCUMENTS

DE    102014218901 A1    3/2016
DE    102014219467 A1    3/2016
DE    102015218086 A1    3/2017

OTHER PUBLICATIONS

German Office Action for German Application No. 10 2017 211 677.3 dated Feb. 28, 2019.

*Primary Examiner* — Dominic E Hawkins
(74) *Attorney, Agent, or Firm* — Lempia Summerfield Katz LLC

(57) ABSTRACT

The invention relates to a method for reconstructing magnetic resonance images, to a magnetic resonance apparatus and to a computer program product. According to the method, measurement data is acquired in an acquisition period. The measurement data is used to determine a motion curve over the acquisition period. In addition, at least one magnetic resonance image is reconstructed. In this process, the acquisition period is separated into a plurality of sub-periods by one or more separating periods and/or separating times in which the motion curve satisfies a defined motion condition, and each magnetic resonance image is reconstructed using the measurement data from at least one sub-period.

20 Claims, 5 Drawing Sheets

(51) Int. Cl.
*G01R 33/561* (2006.01)
*G01R 33/48* (2006.01)
*G01R 33/567* (2006.01)

(52) U.S. Cl.
CPC ... *G01R 33/5676* (2013.01); *G01R 33/56509* (2013.01); *G06T 2211/424* (2013.01)

(56) References Cited

U.S. PATENT DOCUMENTS

| | | | |
|---|---|---|---|
| 6,359,957 B1* | 3/2002 | Toth | A61B 6/032 378/15 |
| 2004/0082846 A1* | 4/2004 | Johnson | A61B 5/02014 600/410 |
| 2009/0209846 A1* | 8/2009 | Bammer | A61B 5/055 600/421 |
| 2012/0169336 A1* | 7/2012 | Leigh | A61B 5/055 324/309 |
| 2012/0243756 A1* | 9/2012 | Samsonov | G01R 33/56509 382/131 |
| 2013/0058551 A1* | 3/2013 | Hong | G06T 11/006 382/131 |
| 2013/0102881 A1* | 4/2013 | Miyazaki | A61B 5/0263 600/413 |
| 2013/0251225 A1 | 9/2013 | Liu | |
| 2014/0119611 A1* | 5/2014 | Prevrhal | G06T 11/006 382/107 |
| 2014/0235965 A1* | 8/2014 | Tran | A61B 5/0006 600/301 |
| 2014/0368194 A1* | 12/2014 | Bauer | G01R 33/4828 324/309 |
| 2015/0077112 A1* | 3/2015 | Otazo | A61B 5/055 324/318 |
| 2015/0204961 A1* | 7/2015 | Ivancevic | G01R 33/5601 324/309 |
| 2015/0317793 A1* | 11/2015 | Zhang | G06T 7/20 382/130 |
| 2015/0334304 A1* | 11/2015 | Gavant | H04N 5/23258 348/208.1 |
| 2016/0081588 A1 | 3/2016 | Zeller | |
| 2016/0091591 A1 | 3/2016 | Grodzki | |
| 2016/0349346 A1* | 12/2016 | Cheng | G01R 33/56509 |
| 2017/0082716 A1 | 3/2017 | Greiser et al. | |

* cited by examiner

MOVEMENT-DEPENDENT RECONSTRUCTION OF MAGNETIC RESONANCE IMAGES

The invention relates to a method for reconstructing magnetic resonance images, to a magnetic resonance apparatus and to a computer program product.

In medical technology, high and variable soft-tissue contrasts are a particular feature of imaging using magnetic resonance (MR), also known as magnetic resonance imaging (MRI). In this technique, a magnetic resonance apparatus is used to expose a subject under examination to excitation pulses which trigger magnetic resonance signals in the subject under examination. The magnetic resonance signals are received as measurement data by the magnetic resonance apparatus and used to reconstruct magnetic resonance images.

Movements of the subject under examination, in particular of a patient, often produce artifacts in the magnetic resonance images. Therefore techniques have already been developed that in particular take account of periodic cardiac and/or respiratory movements, as disclosed in DE 102015218086 A1, DE 102014219467 A1 and DE 102014218901 B4 for example.

The object of the present invention can be considered that of reducing motion artifacts even more effectively than hitherto.

This object is achieved by the features of the independent claims. Advantageous embodiments are described in the dependent claims.

A method for reconstructing magnetic resonance images, in particular of a subject under examination, is accordingly proposed, which method comprises the following steps. Measurement data is acquired in an acquisition period. The measurement data is used to determine a motion curve over the acquisition period. Said motion curve is used to separate the acquisition period into a plurality of sub-periods by one or more separating times and/or separating periods by means of a defined motion condition. In particular, the acquisition period is separated into a plurality of sub-periods by one or more separating times and/or separating periods for which and/or in which the motion curve satisfies the defined motion condition. In addition, at least one magnetic resonance image is reconstructed, wherein each magnetic resonance image is reconstructed using the measurement data from at least one of the plurality of sub-periods.

The measurement data is preferably acquired during the acquisition period by a magnetic resonance apparatus. The measurement data is preferably time-resolved and/or time-dependent and/or dynamic measurement data, i.e. the measurement data comprises measurement values which are each also associated with the time of the acquisition. The acquisition times of the measurement data usually lie in the acquisition period. The acquisition period usually has a start time and an end time. These times, however, need not necessarily be the start time and end time of the entire magnetic resonance examination of the subject under examination, i.e. need not necessarily bound the entire magnetic resonance examination. Instead, the start time and the end time of the acquisition period can also bound just a portion of the magnetic resonance examination, in particular of a measurement protocol.

A motion curve is preferably derived from the time-dependent measurement data. The motion curve is preferably a curve that corresponds to a motion profile, in particular an average and/or integral motion profile. The motion curve is in particular a curve that associates a motion value to each of a set of times, which cover the acquisition period, i.e. the motion curve can comprise a set of value pairs each comprising a motion value and a time in the acquisition period. The motion curve thus typically extends over the acquisition period.

The motion value is preferably a measure of how strongly the subject under examination, in particular a part of the subject under examination, located in a measurement field of the magnetic resonance apparatus, is moving at that instant in time. Measurement data from the entire measurement field preferably contributes to the motion curve, for instance by measurement data and/or values derived therefrom from the entire measurement field being summed and/or integrated to produce the motion values. The measurement field is preferably a spatial region in which the magnetic resonance apparatus applies excitation pulses, and from which the magnetic resonance apparatus receives, as measurement data, magnetic resonance signals resulting from the excitation.

It is hence possible to use the motion curve to identify in particular strong movements of the subject under examination. The defined motion condition is preferably suitable for identifying strong movements of the subject under examination, for instance a movement of the arm.

The motion curve is preferably determined by an analysis unit, which the magnetic resonance apparatus preferably comprises. This analysis unit preferably comprises a programmable processing unit, for instance containing a processor and/or a memory.

The analysis unit is preferably also designed to separate the acquisition period into a plurality of sub-periods by one or more separating times and/or separating periods in which the motion curve satisfies a defined motion condition. In particular, the analysis unit is also designed to check whether the motion curve satisfies the defined motion condition. If this is the case, the plurality of sub-periods are preferably determined within the acquisition period. The sub-periods are usually separated from one another by the separating times and/or separating periods. A separating period can be understood to mean, for instance, a period having a start time and an end time, between which start time and end time the defined motion condition is satisfied, in particular continuously.

The magnetic resonance images are reconstructed preferably by a reconstruction unit. Like the analysis unit, the reconstruction unit can also comprise a processing unit containing a processor and/or a memory. It is also conceivable that the reconstruction unit and the analysis unit are combined in a shared unit.

The reconstruction of a magnetic resonance image preferably incorporates the measurement data from one or more sub-periods, but not the measurement data from the separating times and/or the separating periods. The reconstruction can hence take into account any movements of the subject under examination, in particular those movements that occur during the separating times and/or separating periods.

The separating times and/or separating periods are preferably the times and/or periods in which the subject under examination moves, in particular moves in a non-periodic manner. Motion artifacts can be prevented by discarding the measurement data from these times and/or periods. In particular, times and/or time windows containing strong movement can hence be identified and filtered out and/or discarded for the reconstruction.

If, for example, during the acquisition period the patient moves a body part, e.g. an arm, from a first position into a second position, then this movement is advantageously reflected in the determined motion curve. The acquisition period can be separated, for example, into a first sub-period, in which said body part of the patient lies in the first position, and into a second sub-period, in which the body part of the patient lies in the second position. The separating time and/or separating period can be considered to be the time and/or period of the movement of the body part. It is thus possible to separate the associated sets of measurement data from each other and to prevent any resultant artifacts in the reconstructed magnetic resonance images.

Moreover, the motion curve can also be used to reduce artifacts, for instance caused by periodic respiratory movements.

According to an embodiment of the method, each magnetic resonance image is reconstructed using the measurement data from only one of the plurality of sub-periods.

In particular for short, irreversible movement sequences, i.e. in which there is a change in the position after the movement, for the reconstruction, a phase of the movement can be removed from the measurement data, and the data in sub-blocks associated with the plurality of sub-periods can be used separately.

In this case, preferably rather than using the measurement data from a plurality of sub-periods to reconstruct each magnetic resonance image, instead the number of sub-periods in which the measurement data has been acquired for reconstructing a magnetic resonance image equals one. Thus the reconstruction of a magnetic resonance image incorporates just the measurement data from only one sub-period, i.e. it does not incorporate the measurement data from a plurality of sub-periods. Of course a first magnetic resonance image of the at least one magnetic resonance image can be reconstructed using the measurement data from a first sub-period, and a further magnetic resonance image of the at least one magnetic resonance image can be reconstructed using the measurement data from the first sub-period or alternatively from a further sub-period, which differs from the first sub-period. In this variant of the method, however, measurement data from different sub-periods is not used for reconstructing a single magnetic resonance image, i.e. no combining of measurement data from different sub-periods takes place.

Preferably by using measurement data from only one sub-period, it is possible to prevent combining measurement data from the subject under examination before the movement, where the subject under examination before the movement was in a first positioning state, with measurement data from the subject under examination after the movement, where the subject under examination after the movement was in a positioning state that differs from the first positioning state. Artifacts resulting from the different positioning states can hence be excluded. Different positioning states can arise, for instance, if an arm of the patient comes to rest after a movement in a different position than before the movement.

A magnetic resonance image is preferably reconstructed using measurement data from a plurality of the plurality of sub-periods. Said plurality of sub-periods are advantageously spaced apart from one another in time only by one separating time and/or separating period, i.e. said sub-periods are advantageously consecutive sub-periods. This is advantageous especially when the position of the subject under examination after a movement is substantially the same as before the movement. The data base for the reconstruction can be improved by using the measurement data from a plurality of sub-periods.

For example for reversible movement sequences, i.e. in which there is no change in the position after the movement, for the reconstruction, measurement data can be removed selectively on the basis of the motion curve, and only the remaining measurement data in a data block can be used.

According to a preferred embodiment of the method, on the basis of a defined position condition, in particular on the basis of a result of a comparison of the defined position condition with the motion curve, each magnetic resonance image is reconstructed using the measurement data from only one of the plurality of sub-periods or using the measurement data from a plurality of the plurality of sub-periods.

The defined position condition is preferably designed such that it can be used to detect whether after the movement the subject under examination assumes his original position before the movement. In particular, the motion curve can be checked with regard to the defined position condition.

If the result of the check is that after the movement, the subject under examination does not assume again his original position before the movement, then the magnetic resonance image is advantageously reconstructed using the measurement data from only one of the plurality of sub-periods. It is thereby possible to prevent artifacts that originate from superposition of measurement data from the subject under examination that was acquired while the subject under examination was in different positions.

If the result of the check is that after the movement, the subject under examination assumes again his original position before the movement, then the magnetic resonance image is advantageously reconstructed using the measurement data from a plurality of the plurality of sub-periods. This can expand the data base for reconstructing the magnetic resonance image.

The defined position condition can be satisfied, for instance, by a defined threshold value being exceeded. The defined threshold value can be compared, for example, with a difference in an amplitude, in particular the absolute value of a difference in an amplitude, at the start and end of a separating time and/or separating period.

According to an embodiment of the method, the separating times and/or separating periods have a non-periodic pattern, i.e. only those times and/or periods that have a non-periodic pattern are used as separating times and/or separating periods. It is thereby possible, for example, to distinguish periodic respiratory movements from non-periodic movements of the arms or legs of the patient.

A non-periodic pattern is preferably a pattern that does not include any regularly repeating elements. For instance, the separating times and/or separating periods do not exhibit any regular time intervals between one another.

According to an embodiment of the method, the motion curve is filtered according to frequency. In particular, filtering the motion curve can comprise suppressing a respiratory signal of the patient by filtering for higher frequencies and/or suppressing a contrast agent variation by filtering for lower frequencies. This advantageously leaves just signal variations caused by additional movements.

According to an embodiment of the method, the defined motion condition is satisfied by a defined threshold value being exceeded. For instance, if a motion value of the motion curve exceeds the defined threshold value at a time and/or a time period, then this time and/or a time period can be identified as separating times and/or separating periods. The defined threshold value can be determined either empirically e.g. by test measurements, and/or theoretically, e.g. by simulations, before the measurement data is acquired.

Using a defined threshold value as the defined motion condition is a particularly simple way to specify said motion condition. More complex conditions that could be used here are also conceivable, however.

According to an embodiment of the method, the reconstruction is performed using measurement data that was acquired at different times in the relevant sub-period, i.e. the measurement data that was acquired at different times in the relevant sub-period is used together for reconstructing the magnetic resonance image. Preferably the reconstruction of a magnetic resonance image that images the subject under examination at a specific time instant incorporates measurement data that was acquired at a different time from this specific time instant.

The maximum time interval between the different times at which the measurement data used for the reconstruction was acquired equals here in particular at least 10 ms, in particular more than 100 ms, in particular more than 500 ms, i.e. a reconstruction of a single magnetic resonance image incorporates measurement data that was acquired at times that are spaced apart from one another by at least 10 ms, in particular more than 100 ms, in particular more than 500 ms. The various sub-periods are consequently preferably in particular at least 10 ms long, in particular more than 100 ms long, in particular more than 500 ms long.

The method can be applied particularly advantageously in this case because for a reconstruction using measurement data that was acquired at different times, any combining of measurement data that was acquired before and after a movement of the patient would have a particularly negative effect on the result of the reconstruction.

According to an embodiment of the method, the motion curve is determined using measurement data from a central k-space region, i.e. a central region of k-space. It has been ascertained that the central region is particularly well-suited to generating the motion curve therefrom. In particular, measurement data from the central region is particularly well-suited to imaging an integral motion of the subject under examination.

k-space, sometimes also referred to as the spatial frequency domain or Fourier domain, usually constitutes a representation of the measurement data. k-space is filled at least partially by the measurement data. In particular, a magnetic resonance image can be generated by a Fourier transform of k-space. The central region of k-space is preferably the region that is up to 20%, in particular 5%, in particular up to 1% of the total extent of the acquired k-space away from the center of k-space. The center of k-space may be, for example, the center, in particular the centroid, of the points in k-space that are sampled by the measurement data. The total extent of the acquired k-space may be, for example, a maximum distance of the points in k-space that are sampled by the measurement data.

According to an embodiment of the method, the measurement data exhibits a sampling pattern that comprises trajectories passing through a central k-space region, i.e. a central region of k-space, in particular through the center of k-space.

Such sampling patterns can ensure that a portion of the central region of k-space, in particular the center of k-space, is sampled repeatedly in quick succession. Preferably, the times at which the trajectories pass through the central region of k-space are spaced apart from one another at most by 1000 ms, in particular 500 ms, in particular 250 ms. It is hence possible to generate a motion curve having a high temporal resolution, for instance a temporal resolution of 1000 ms, in particular 500 ms, in particular 250 ms.

In contrast, for instance for Cartesian sampling of k-space, specifically for sampling in which k-space is sampled row by row, it would take a relatively long time after the central region of k-space has been sampled before the central region of k-space is next sampled.

According to an embodiment of the method, the trajectories, in particular in k-space, are in the form of spokes, in particular radial spokes. Such trajectories in particular allow a high repetition frequency of the sampling of the central region of k-space.

The spokes preferably have at least one sample point, in particular as the end point of the trajectory, that lies in the center of k-space.

A spoke-shaped trajectory can be understood to mean in particular a trajectory that runs in a straight line and in particular intersects the center of k-space. A spoke-shaped trajectory can be understood to mean in particular a trajectory that runs in a spiral path, i.e. is spiral in shape, and in particular intersects the center of k-space. Thus the spokes can in particular be in the form of a straight line and/or a spiral.

The time interval between the acquisition of two spokes preferably equals 50 to 400 ms, in particular 100 to 200 ms. The plurality of sub-periods into which the acquisition period is separated by one or more separating times and/or separating periods preferably comprise a period in which at least one spoke, preferably a plurality of spokes, is acquired.

According to an embodiment of the method, successive spokes, in particular spokes that are successive in time, are rotated by a golden angle, in particular about the center of k-space.

The sampling pattern preferably comprises a plurality of spokes, with each of the plurality of spokes of the sampling pattern having an offset relative to a previous and/or subsequent spoke that equals a golden angle, i.e. the n'th spoke is rotated with respect to the (n−1)th and/or the (n+1)th spoke by the golden angle.

The golden angle $\varphi_{golden}$ can be understood to mean in particular an angle of $\varphi_{golden,s}=\pi(3-5^{0.5})$ in radians and/or approximately $\varphi_{golden,s}\approx 137.5°$ in degrees, which can also be referred to as the small golden angle, and or an angle of $\varphi_{golden,b}=\pi(5^{0.5}-1)$ in radians and/or approximately $\varphi_{golden,b}\approx 222.5°$ in degrees, which can also be referred to as the large golden angle. Repeated rotation by the golden angle results in trajectories that never exactly overlap one another. In addition, a rotation by the golden angle allows relatively even coverage of k-space, because the (n+1)th spoke lies approximately centrally in the largest region that is not yet covered by the previous n spokes.

If the spokes are rotated by the golden angle, then the sampled points of k-space in each of the plurality of sub-periods are advantageously evenly distributed in k-space in such a way that usually measurement data is available that is suitable for reconstructing the magnetic resonance image. It is possible for the reconstruction to discard in particular measurement data already acquired, without this resulting in unusable magnetic resonance images, because k-space is still sufficiently filled with measurement data. In particular, artifacts in the reconstructed magnetic resonance images can be prevented effectively.

According to an embodiment of the method, the measurement data comprises subsampling, in particular of k-space. The acquired measurement data thus preferably does not fully sample k-space in accordance with the Nyquist theorem but only partially. This provides in particular the advantage that the measurement data can be acquired even more quickly and hence also the temporal resolution of the reconstructed magnetic resonance images can be increased further. This can be a major advantage especially for time-resolved and/or time-dependent and/or dynamic measurements.

According to an embodiment of the method, the magnetic resonance image is reconstructed using an iterative reconstruction technique and/or a view-sharing technique.

An iterative reconstruction technique can refer in particular to a compressed sensing technique. These are suitable in particular for reconstructing subsampled k-spaces and hence for time-resolved and/or time-dependent and/or dynamic measurements.

Iterative reconstruction techniques are advantageously relatively insensitive to small reversible movements of the patient. Using an iterative reconstruction, a signal can advantageously be stabilized by regularization over a prolonged period of time. This allows in particular a high temporal resolution that can be used, for example, to image contrast agent variations.

If, however, for example the patient makes a strong movement, e.g. by moving the arms, then owing to the regularization of the reconstruction in the time direction, this movement can corrupt not only the magnetic resonance image at the time of the strong movement but also the magnetic resonance images at adjacent or even further removed instants of time. This can result in particular in the entire examination of the patient being unusable for diagnostic purposes. Moreover, measurements involving administration of contrast agent cannot be repeated immediately after a failed measurement.

The invention is based in particular on the finding that the motion curve can be used to detect a strong movement of the subject under examination, and the described motion artifacts can be prevented by dividing the measurement data into a plurality of sub-periods on the basis of the motion curve.

View-sharing techniques are also particularly suitable for time-resolved and/or time-dependent and/or dynamic measurements, in particular of imaging using contrast agents. Preferably in this case, initially, before administration of the contrast agent, measurement data is captured that samples k-space at least partially over its entire extent in order to obtain measurement data having a high spatial resolution. After administration of the contrast agent, then preferably measurement data is captured that primarily samples the central region of k-space at high frequency in order to obtain a high temporal resolution of the contrast agent variation. In the reconstruction, the measurement data acquired before and after the administration of the contrast agent is combined, so that magnetic resonance images of the contrast agent variation can be produced that have a high spatial and temporal resolution.

According to an embodiment of the method, the acquisition of the measurement data and/or the reconstruction of the magnetic resonance image are performed using a GRASP technique. GRASP (Golden-Angle RAdial Sparse Parallel) combines the advantages of a sampling pattern containing spokes offset by the golden angle with an iterative reconstruction technique, in particular a compressed sensing technique, in a particularly advantageous manner. The GRASP technique is beneficial in particular in acquiring the measurement data involving free-breathing of the patient, i.e. without holding of breath by the patient.

According to an embodiment of the method, a warning is issued if the motion curve satisfies a defined warning condition.

For example, if during an examination using a contrast agent, a reference measurement is performed before administration of the contrast agent, and during this reference measurement a strong movement of the patient is identified from the motion curve, then the operator of the magnetic resonance apparatus can be warned even before the contrast agent is administered. Thus, for instance, the reference measurement can be terminated and/or repeated in good time.

A magnetic resonance apparatus is also proposed, which is designed to perform a method according to the invention for reconstructing magnetic resonance images.

The advantages of the magnetic resonance apparatus according to the invention are essentially the same as the advantages of the method according to the invention for reconstructing magnetic resonance images, which advantages are explained in detail above. Features, advantages or alternative embodiments mentioned in this connection can also be applied to the magnetic resonance apparatus according to the invention.

In addition, a computer program product is proposed, which comprises a program and can be loaded directly into a memory of a programmable processing unit of an analysis unit and/or reconstruction unit, and comprises program means, e.g. libraries and auxiliary functions, in order to perform a method according to the invention when the computer program product is executed in the processing unit of the analysis unit and/or reconstruction unit. Said computer program product can comprise software containing a source code, which still needs to be compiled and linked or just needs to be interpreted, or an executable software code, which for execution only needs to be loaded into the analysis unit and/or reconstruction unit. The method according to the invention can be performed quickly, reproducibly and robustly by the computer program product. The computer program product is configured such that it can use the analysis unit and/or reconstruction unit to perform the method steps according to the invention. Therefore, the analysis unit and/or reconstruction unit must have the necessary specification such as, for example, a suitable RAM, a suitable graphics card or a suitable logic unit, in order to be able to perform the respective method steps efficiently. The computer program product is stored, for example, on a computer-readable medium or on a network or server.

In addition, control data of the computer program product can be stored on an electronically readable data storage medium. The control data in the electronically readable data storage medium can be embodied such that it performs a method according to the invention when the data storage medium is used. Examples of electronic readable data storage media are a DVD, a magnetic tape or a USB stick, on which is stored electronically readable control data, in particular software. When this control data is read from the data storage medium and stored in an analysis unit and/or reconstruction unit, all the embodiments according to the invention of the above-described method can be performed. Hence the invention can also proceed from said computer-readable medium and/or from said electronically readable data storage medium.

Further advantages, features and details of the invention appear in the exemplary embodiments described below and follow from the drawings. Corresponding parts are denoted by the same reference signs in all the figures, in which.

Figure 1:
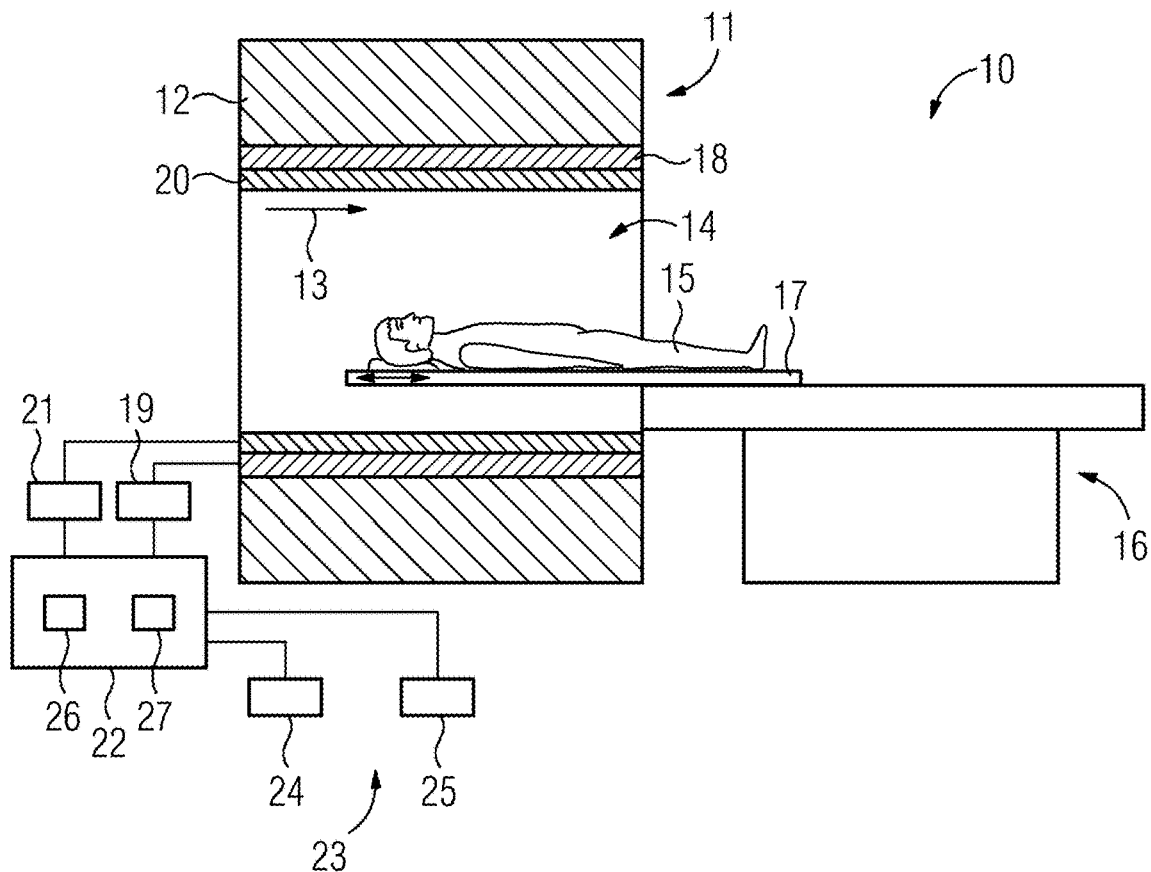
FIG. 1 shows in a schematic diagram a magnetic resonance apparatus according to the invention.

FIG. 1 shows schematically a magnetic resonance apparatus 10. The magnetic resonance apparatus 10 comprises a magnet unit 11, which contains a main magnet 12 for producing a powerful main magnetic field 13, which in particular is constant over time. The magnetic resonance apparatus 10 also comprises a patient placement zone 14 for accommodating a patient 15. In the present exemplary embodiment, the patient placement zone 14 is shaped as a cylinder and is enclosed in a circumferential direction cylindrically by the magnet unit 11. In principle, however, it is always possible for the patient placement zone 14 to have a different design. The patient 15 can be moved into the patient placement zone 14 by a patient support apparatus 16 of the magnetic resonance apparatus 10. The patient support apparatus 16 comprises for this purpose a patient couch 17, which is designed to be able to move inside the patient placement zone 14.

The magnet unit 11 further comprises a gradient coil unit 18 for generating magnetic field gradients, which are used for spatial encoding during imaging. The gradient coil unit 18 is controlled by a gradient control unit 19 of the magnetic resonance apparatus 10. The magnet unit 11 also comprises a radio-frequency antenna unit 20, which in the present exemplary embodiment is designed as a body coil that is fixedly integrated in the magnetic resonance apparatus 10. The radio-frequency antenna unit 20 is designed to excite atomic nuclei, which excitation is established in the main magnetic field 13 produced by the main magnet 12. The radio-frequency antenna unit 20 is controlled by a radio-frequency antenna control unit 21 of the magnetic resonance apparatus 10 and radiates high-frequency magnetic resonance sequences into an examination space, which is largely formed by a patient placement zone 14 of the magnetic resonance apparatus 10. The radio-frequency antenna unit 20 is also designed to receive measurement data in the form of magnetic resonance signals. The main magnet 12, the gradient coil unit 18, the gradient control unit 19, radio-frequency antenna unit 20 and the radio-frequency antenna control unit 21 thus constitute an example of an acquisition unit for acquiring measurement data in an acquisition period.

The magnetic resonance apparatus 10 comprises a system control unit 22 for controlling the main magnet 12, the gradient control unit 19 and the radio-frequency antenna control unit 21. The system control unit 22 centrally controls the magnetic resonance apparatus 10, for instance implementing a predetermined imaging gradient echo sequence. In addition, the magnetic resonance apparatus 10 comprises a user interface 23, which is connected to the system control unit 22. Control data such as imaging parameters, for instance, and reconstructed magnetic resonance images can be displayed to medical personnel on a display unit 24, for example on at least one monitor, of the user interface 23. In addition, the user interface 23 comprises an input unit 25, which can be used by the medical operating personnel to enter data and/or parameters during a measurement process.

In addition, the system control unit 22 comprises an analysis unit 26 for using the measurement data to determine a motion curve over the acquisition period, and a reconstruction unit 27 for reconstructing at least one magnetic resonance image. The analysis unit is designed to use said motion curve to separate the acquisition period into a plurality of sub-periods by one or more separating times and/or separating periods by means of a defined motion condition. In particular, the analysis unit is designed to separate the acquisition period into a plurality of sub-periods by one or more separating times and/or separating periods for which and/or in which the motion curve satisfies a defined motion condition. The reconstruction unit is designed to reconstruct each magnetic resonance image using the measurement data from only one sub-period.

The analysis unit 26 and/or the reconstruction unit 27 comprise a programmable processing unit containing a memory. A program containing program means for performing a method according to the invention for reconstructing magnetic resonance images, as explained by way of example with reference to FIG. 2, can be loaded into the memory.

Figure 2:
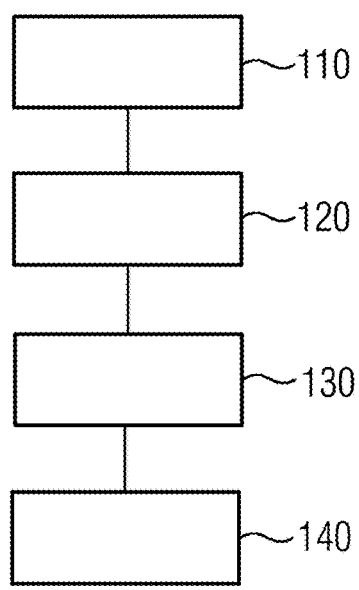
FIG. 2 shows in a schematic block diagram a method according to the invention.

A method according to the invention is described in detail by way of example with reference to FIG. 2. In step 110, measurement data is acquired in an acquisition period. The measurement data, for example in the form of magnetic resonance signals, can be received by the radio-frequency antenna unit 20. In step 120, the measurement data is used to determine a motion curve over the acquisition period. For example when using the GRASP technique, a signal curve can be generated by the continuous radial measurement, which curve, in particular when filtered, corresponds to an average motion profile of the patient 15.

In step 130, the motion curve is used to separate the acquisition period into a plurality of sub-periods by one or more separating times and/or separating periods by means of a defined motion condition. In particular, the acquisition period is separated on the basis of a defined motion condition into a plurality of sub-periods by one or more separating times and/or separating periods for which and/or in which the motion curve satisfies a defined motion condition.

In step 140, at least one magnetic resonance image is reconstructed, wherein each magnetic resonance image is reconstructed using the, in particular subsampled, measurement data from at least one, in particular only one, of the plurality of sub-periods.

Figure 3:
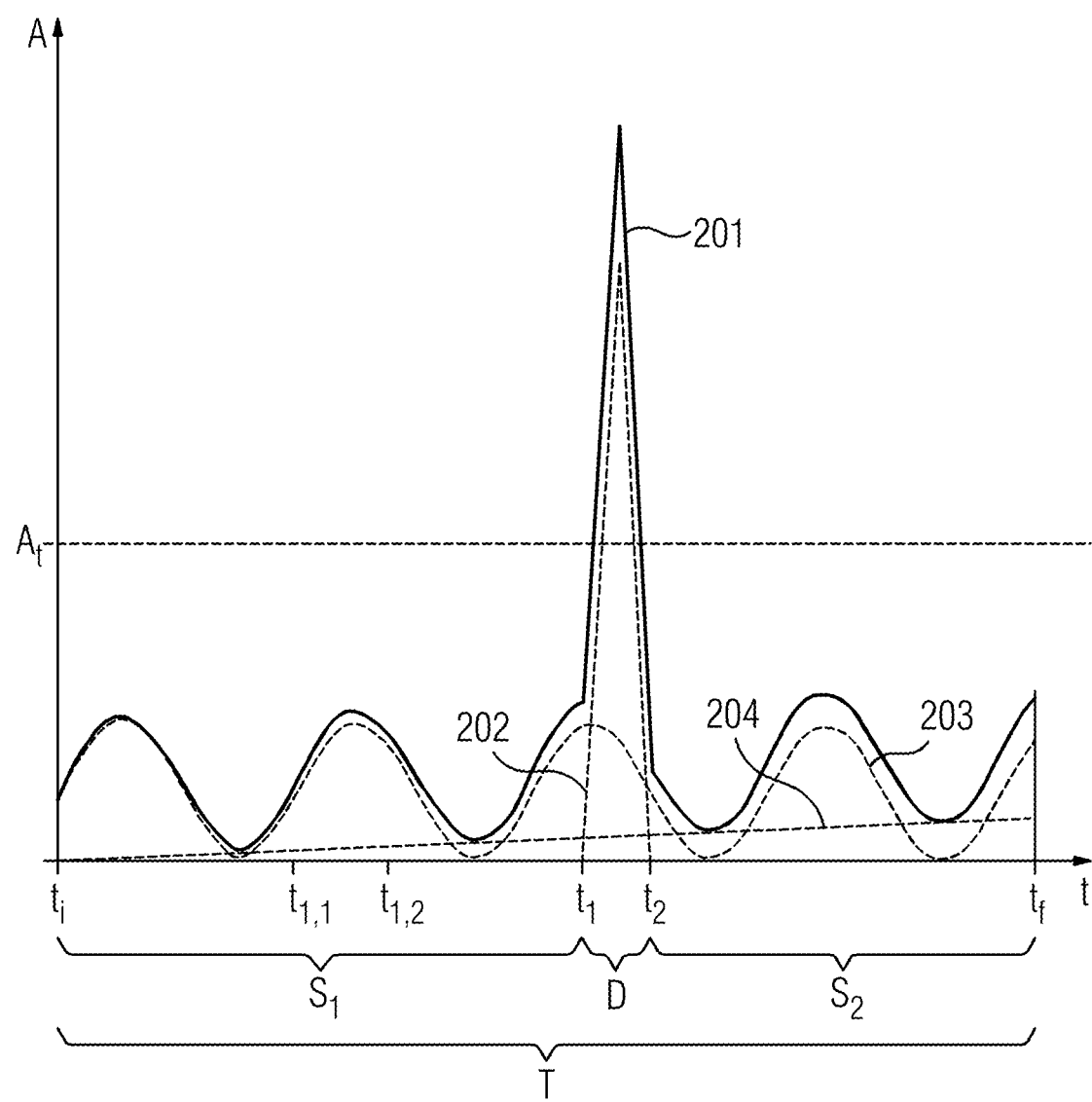
FIG. 3 shows an example graph containing a motion curve of a reversible movement.

FIG. 3 shows by way of example a motion curve 201 over an acquisition period T, which extends from a time $t_i$ to a time $t_f$. The motion curve 201 is described by an amplitude A as a function of time t. The amplitude A is here composed of a plurality of components:

a periodic component 203 of relatively high frequency, which may be produced, for instance, by a respiratory movement of the patient 15;

a component 204, which rises at a relatively flat rate and which may be produced, for example, by arrival of a contrast agent bolus;

a relatively strong component 202, which, for instance, may be produced between the time $t_1$ and the time $t_2$ by a strong movement of the patient 15, e.g. by a movement of the arm.

The acquisition period T is separated by the period between $t_1$ and $t_2$, a separating period D, into the sub-period $S_1$ between $t_i$ and $t_1$ and the sub-period $S_2$ between $t_2$ and $t_f$. The separating period is determined on the basis of a defined motion condition. In this example, the motion curve 201 in the separating period D satisfies a defined motion condition, specifically that the amplitude A exceeds a threshold value $A_t$. It is also conceivable, however, for example, that the separating period D is bounded by the times at which the time derivative dA/dt of the amplitude A exceeds a defined threshold value.

The threshold value can be determined in advance by experiments and/or simulations. This motion condition is a particularly simple condition for detecting a strong movement of the patient 15.

In addition, the motion curve 201 can be filtered according to frequency, for instance by using one or more frequency filters to filter out the periodic component 203 and/or the flat component 202 to leave just the strong component 202. The strong movement of the patient 15, which movement produces the strong component 202, can thereby be identified even more easily.

At least one first magnetic resonance image is reconstructed, for example, from measurement data that was acquired only in the sub-period $S_1$. At least one second magnetic resonance image is reconstructed, for example, from measurement data that was acquired only in the sub-period $S_2$. In this case, neither the at least one first magnetic resonance image nor the at least one second magnetic resonance image is corrupted by the strong movement of the patient 15.

In the example shown in FIG. 3, after the separating period D at time $t_2$, the amplitude of the component 202 returns again substantially to the initial value at time $t_1$, i.e. $A(t_1) \approx A(t_2)$. This is typically the case if, after the movement, the patient assumes his original position again.

Figure 4:
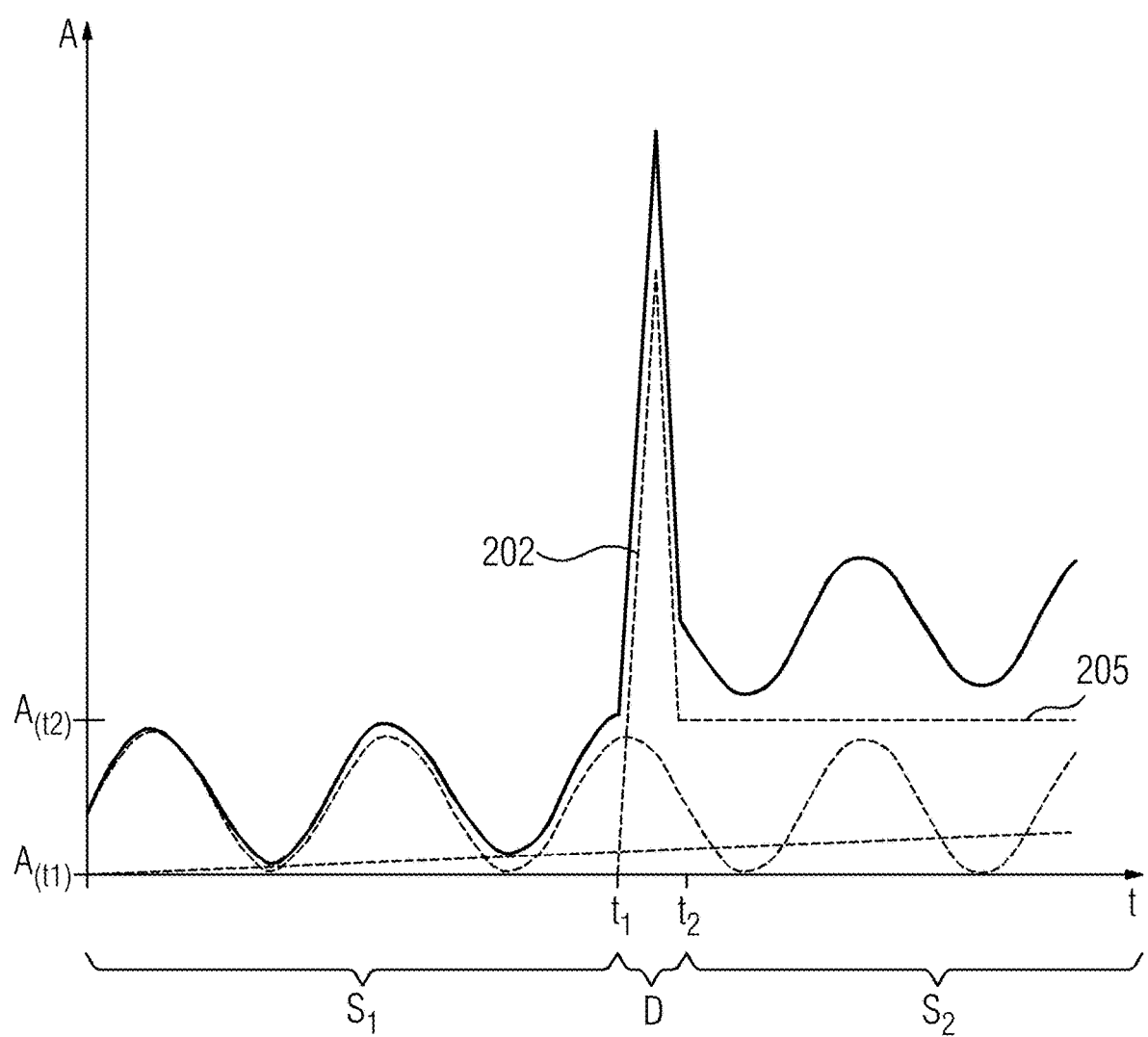
FIG. 4 shows an example graph containing a motion curve of an irreversible movement.

In contrast, in the example shown in FIG. 4, after the separating period D at time $t_2$, the amplitude of the component 202 has a different value than at time $t_1$, i.e. $A(t_1) \neq A(t_2)$. This is typically the case if, after the movement, the patient assumes a different position.

If in particular after the strong movement of the patient 15, so after $t_2$, for instance the arm of the patient 15 were to come to lie in a different position, then artifacts would be produced in the reconstructed magnetic resonance image if this were to be reconstructed using the measurement data from $S_1$ and $S_2$. Thus especially for irreversible movements of the patient 15, it is advantageous not only to discard the measurement data in the separating period but also to reconstruct the measurement data from the sub-periods $S_1$ and $S_2$ separately.

On the other hand, for the case shown in FIG. 3, it is conceivable to reconstruct a magnetic resonance image using the measurement data from the sub-periods $S_1$ and $S_2$ together. This is preferably done if it can be deduced from the motion curve that the movement in the separating period D is a reversible movement, i.e. the position of the patient, for instance the arm of the patient, after the movement is substantially the same as before the movement.

Thus preferably in step 130, not only is the acquisition period separated into sub-periods on the basis of the defined motion condition, but also a defined position condition is used to determine the sub-periods, the measurement data of which is used to reconstruct the at least one magnetic resonance image in step 140.

In step 140, at least one magnetic resonance image is reconstructed, wherein each magnetic resonance image is reconstructed using the, in particular subsampled, measurement data from at least one, in particular only one, of the plurality of sub-periods. Depending on the defined position condition, each magnetic resonance image is reconstructed using the measurement data from only one of the plurality of sub-periods or using measurement data from a plurality of the plurality of sub-periods.

For example, the measurement data from the sub-periods $S_1$ and $S_2$ together can be reconstructed if, as the position condition, the absolute value of the difference in the amplitudes A of the motion curve, in particular after filtering according to frequency, at the start and end of the separating period D does not exceed a predetermined threshold value $T_p$, i.e. $|A(t_1)-A(t_2)| \leq T_p$. Thus in this case, the magnetic resonance image is reconstructed using the measurement data from a plurality of the plurality of sub-periods.

The method according to the invention is preferably applied to imaging dynamic processes such as, for instance, a variation over time in a contrast agent. Thus magnetic resonance images are produced from different times of the acquisition period T, e.g. $t_{1,1}$ and/or $t_{1,2}$.

The reconstruction is advantageously performed using measurement data that was acquired at different times of the particular sub-period $S_1$, $S_2$. For example, a magnetic resonance image is reconstructed from measurement data that was acquired at time $t_{1,1}$, together with measurement data that was acquired at time $t_{1,2}$. An example of such reconstruction techniques is an iterative reconstruction technique using compressed sensing, in particular GRASP. In this technique, regularization is usually performed in the time direction, so that the measurement data that was acquired at the time $t_{1,1}$ also has an effect on a magnetic resonance image that images the patient 15 at the time $t_{1,2}$. Motion artifacts can be avoided by confining the measurement data used for reconstructing a magnetic resonance image to measurement data acquired in a sub-period $S_1$, $S_2$ that does not contain strong movements of the patient 15.

A warning is preferably issued if the motion curve satisfies a defined warning condition, e.g. the threshold value $A_t$ is exceeded. If, for example, a reference measurement is performed, for instance to capture a baseline for a subsequent magnetic resonance measurement based on contrast agent, and during the reference measurement the defined warning condition is satisfied, this can be notified to an operator of the magnetic resonance apparatus 10, for instance via the display unit 24. The reference measurement can then be repeated, for instance, in good time.

Figure 5:
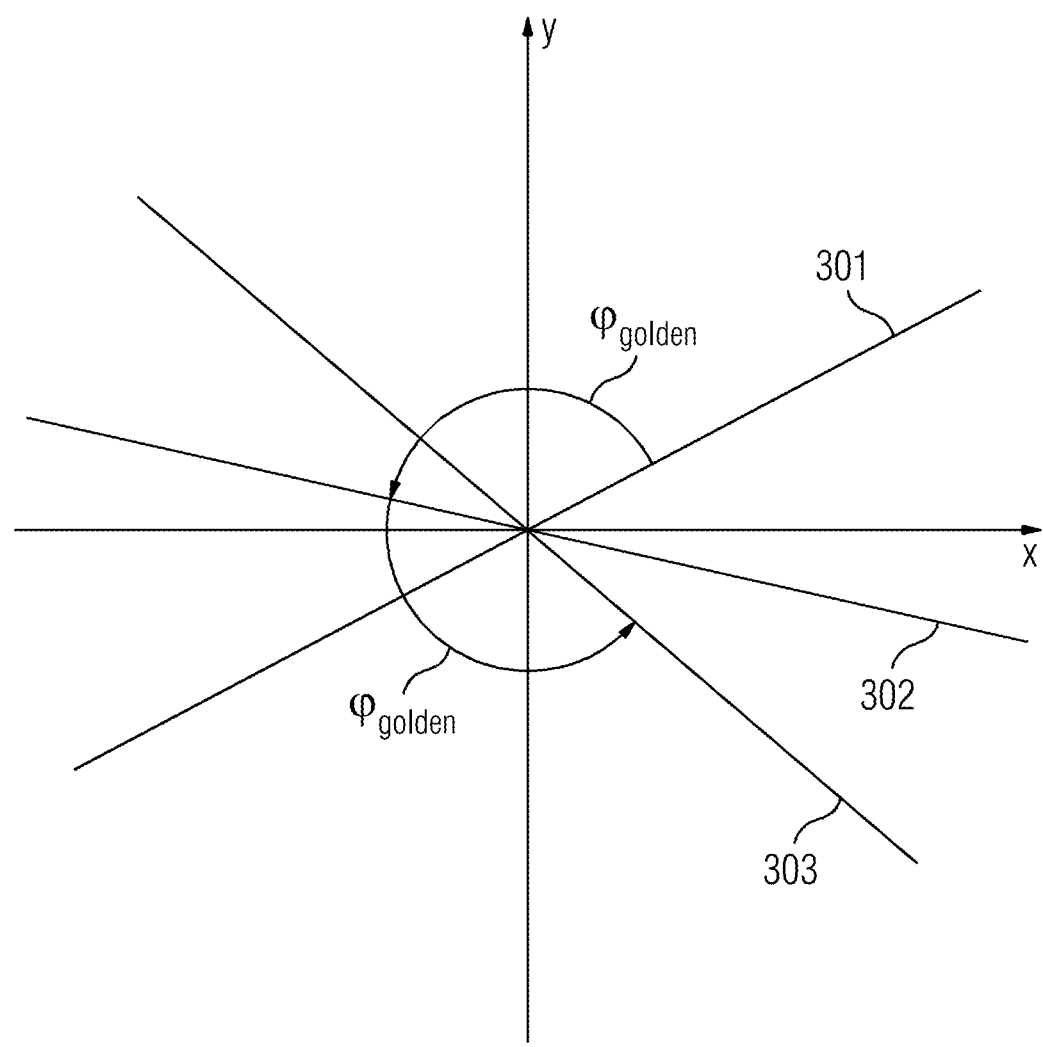
FIG. 5 shows a sampling pattern of k-space containing straight-line spokes.
Figure 6:
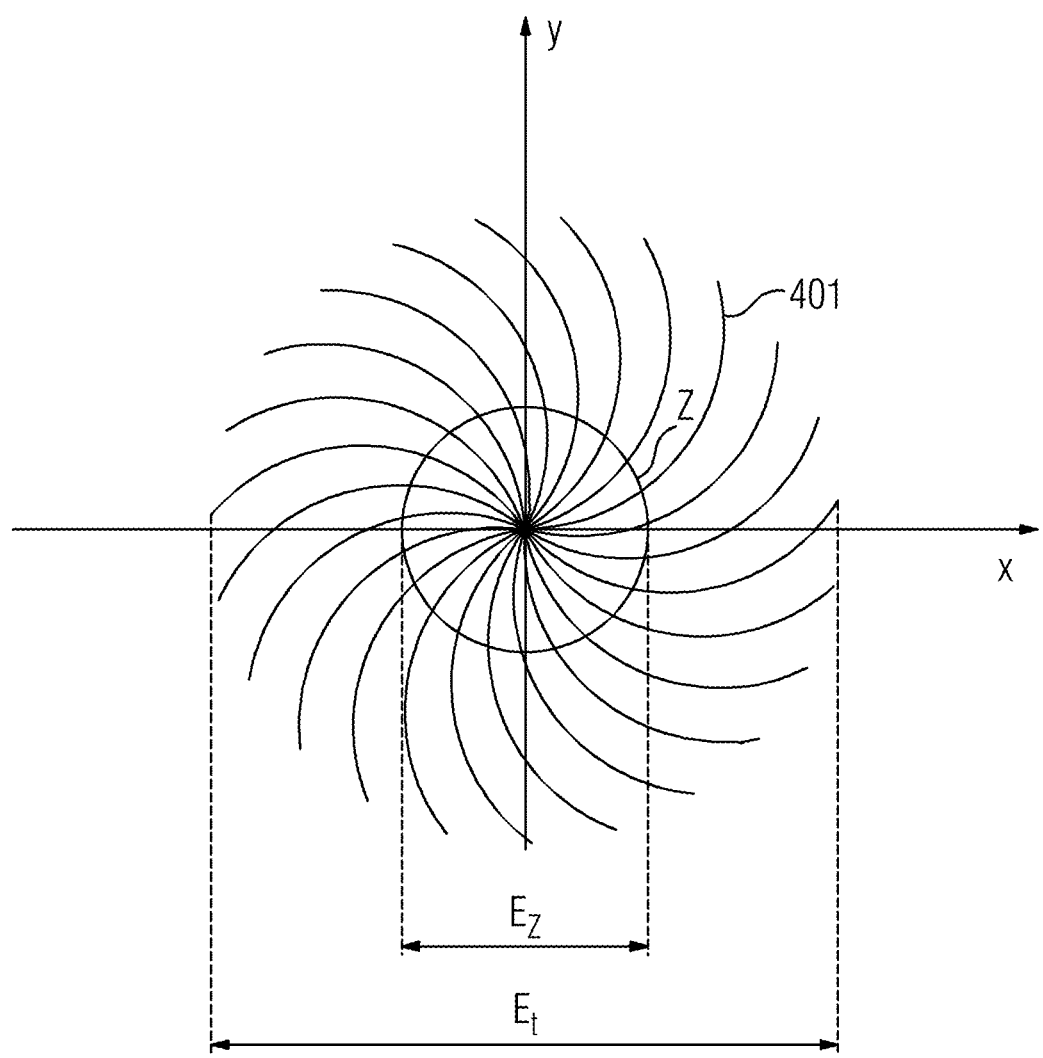
FIG. 6 shows a sampling pattern of k-space containing spiral spokes.

FIGS. 5 and 6 each show a k-space that in each case exhibits a sampling pattern containing trajectories in the form of spokes. The spokes shown in FIG. 5 are straight lines, whereas the spokes shown in FIG. 6 are spiral in shape. The reconstruction is advantageously performed using measurement data that was acquired at different times of the particular sub-period. In relation to this example, this means that the reconstruction is performed on the basis of a plurality of spokes, because the spokes are acquired successively at different times. The time period needed for sampling a spoke often lies between 100 and 200 ms.

The sampling pattern shown in FIG. 5 shows by way of example just three successive spokes 301, 302, 303, which are rotated with respect to one another by a golden angle $\varphi_{golden}$. Hence, for example, the spoke 302 is rotated by the angle $\varphi_{golden}$ with respect to the spoke 301, which is earlier in time, whereas the spoke 303, which follows the spoke 302, is in turn rotated into the golden angle $\varphi_{golden}$. Usually during a measurement, far more spokes are sampled in k-space by the acquired measurement data. The golden angle $\varphi_{golden}$ results in very even coverage of k-space without any two spokes ever overlapping exactly. Thus one or more spokes can even be discarded without having too detrimental an effect on the coverage of k-space by the remaining spokes.

The spokes 401 shown in FIG. 6 are also preferably rotated with respect to one another by a golden angle $\varphi_{golden}$. For reasons of clarity, in this figure a reference sign is used to denote only one spoke as representative.

Preferably only measurement data from a central k-space region, which in this figure is bounded by the circle Z around the center of k-space, is used to determine the motion curve 201. The center of k-space is in this case the intersection of the x-axis and y-axis, i.e. x=0 and y=0. The central region of k-space is preferably the region that is up to 20%, in particular 5%, in particular up to 1% of the total extent $E_t$ of the acquired k-space away from the center of k-space, i.e. $E_z/2/E_t \leq 20\%$ or 5% or 1%.

The spokes in FIG. 5 and the spokes in FIG. 6 pass through a central k-space region and are thus particularly well-suited to determining the motion curve 201.

Finally it should be reiterated that the method described in detail above and the presented acquisition pattern generation unit and magnetic resonance apparatus are merely exemplary embodiments, which can be modified by a person skilled in the art in many ways without departing from the scope of the invention. In addition, the use of the indefinite article "a" or "an" does not rule out the possibility of there also being more than one of the features concerned. Likewise, the term "unit" does not exclude the possibility that the components in question consist of a plurality of interacting sub-components, which may also be spatially distributed if applicable.

The invention claimed is:

1. A method for reconstructing magnetic resonance images, the method comprising:
   acquiring magnetic resonance measurement data in an acquisition period;
   determining a motion curve over the acquisition period using the magnetic resonance measurement data;
   separating the acquisition period into a plurality of sub-periods using the motion curve and a defined motion condition, wherein the plurality of sub-periods are separated by one or more separating times, one or more separating periods, or the one or more separating times and the one or more separating periods; and
   reconstructing at least one magnetic resonance image, wherein each magnetic resonance image of the at least one magnetic resonance image is reconstructed using the magnetic resonance measurement data from at least one sub-period of the plurality of sub-periods.

2. The method of claim 1, wherein each magnetic resonance image of the at least one magnetic resonance image is reconstructed using the magnetic resonance measurement data from only one sub-period of the plurality of sub-periods.

3. The method as claimed in claim 1, wherein, on the basis of a defined position condition, each magnetic resonance image of the at least one magnetic resonance image is reconstructed using the magnetic resonance measurement data from only one sub-period of the plurality of sub-periods, or from more than one sub-period of the plurality of sub-periods.

4. The method of claim 1, wherein the motion curve is filtered according to frequency.

5. The method of claim 1, wherein the defined motion condition is satisfied by a defined threshold value being exceeded.

6. The method of claim 1, wherein the reconstruction is performed using magnetic resonance measurement data that was acquired at different times during the at least one sub-period of the plurality of sub-periods.

7. The method of claim 1, wherein the motion curve is determined using magnetic resonance measurement data from a central k-space region.

8. The method of claim 1, wherein the magnetic resonance measurement data exhibits a sampling pattern that comprises trajectories passing through a central k-space region.

9. The method as claimed in claim 8, wherein the trajectories are in the form of spokes.

10. The method as claimed in claim 9, wherein successive spokes are rotated by a golden angle.

11. The method of claim 1, wherein the magnetic resonance measurement data comprises subsampling.

12. The method of claim 1, wherein the respective magnetic resonance image is reconstructed using an iterative reconstruction technique, a view-sharing technique, or a combination thereof.

13. The method of claim 1, wherein the acquisition of the magnetic resonance measurement data, the reconstruction of the magnetic resonance image, or the acquisition of the magnetic resonance data and the reconstruction of the respective magnetic resonance image are performed using a GRASP technique.

14. The method of claim 1 further comprising:
   issuing a warning when the motion curve satisfies a defined warning condition.

15. A magnetic resonance apparatus comprising:
   an acquisition unit configured to acquire magnetic resonance measurement data in an acquisition period;
   an analysis unit configured to determine a motion curve over the acquisition period using the magnetic resonance measurement data and configured to use the motion curve to separate the acquisition period into a plurality of sub-periods using a defined motion condition, wherein the plurality of sub-periods are separated by one or more separating times, by one or more separating periods, or by the one or more separating times and the one or more separating periods;
   a reconstruction unit configured to reconstruct at least one magnetic resonance image and configured to reconstruct each magnetic resonance image of the at least one magnetic resonance image using the measurement data from only one sub-period of the plurality of sub-periods.

16. The magnetic resonance apparatus of claim 15, wherein each magnetic resonance image of the at least one magnetic resonance image is reconstructed using the measurement data from only one sub-period of the plurality of sub-periods.

17. The magnetic resonance apparatus of claim 15, wherein, based on a defined position condition, each magnetic resonance image of the at least one magnetic resonance image is reconstructed using the measurement data from only one sub-period of the plurality of sub-periods, or from more than one sub-period of the plurality of sub-periods.

18. The magnetic resonance apparatus of claim 15, wherein the motion curve is filtered according to frequency.

19. The magnetic resonance apparatus of claim 15, wherein the motion curve is determined using measurement data from a central k-space region.

20. A non-transitory computer-readable storage medium storing instructions executable by a programmable processing unit of an analysis unit, a reconstruction unit, or the analysis unit and the reconstruction unit, the instructions comprising:
- acquiring measurement data in an acquisition period;
- determining a motion curve over the acquisition period using the measurement data;
- separating the acquisition period into a plurality of sub-periods using the motion curve and a defined motion condition, wherein the plurality of sub-periods are separated by one or more separating times, by one or more separating periods, or by the one or more separating times and the one or more separating periods; and
- reconstructing at least one magnetic resonance image, wherein each magnetic resonance image of the at least one magnetic resonance image is reconstructed using the measurement data from at least one sub period of the plurality of sub-periods.

* * * * *